US008869084B2

(12) United States Patent
Chung et al.

(10) Patent No.: US 8,869,084 B2
(45) Date of Patent: Oct. 21, 2014

(54) PARAMETERIZED CELL LAYOUT GENERATION GUIDED BY A DESIGN RULE CHECKER

(71) Applicants: Synopsys Taiwan Co., Ltd., Taipei (TW); Synopsys, Inc., Mountain View, CA (US)

(72) Inventors: Chien-Fu Chung, Yunlin County (TW); Yuan-Kai Pei, Taipei (TW); Shyh-An Tang, Taichung (TW)

(73) Assignees: Synopsys, Inc., Mountain View, CA (US); Synopsys Taiwan Co., Ltd., Taipei (TW)

( * ) Notice: Subject to any disclaimer, the term of this patent is extended or adjusted under 35 U.S.C. 154(b) by 0 days.

(21) Appl. No.: 13/684,496

(22) Filed: Nov. 24, 2012

(65) Prior Publication Data
US 2013/0185687 A1    Jul. 18, 2013

Related U.S. Application Data

(60) Provisional application No. 61/585,650, filed on Jan. 12, 2012.

(51) Int. Cl.
G06F 17/50    (2006.01)
G06F 11/22    (2006.01)
G06F 9/455    (2006.01)

(52) U.S. Cl.
CPC .................................. *G06F 17/5081* (2013.01)
USPC ........... 716/111; 716/110; 716/119; 716/123; 716/136; 703/13

(58) Field of Classification Search
None
See application file for complete search history.

(56) References Cited

U.S. PATENT DOCUMENTS

| | | | | |
|---|---|---|---|---|
| 6,009,251 A * | 12/1999 | Ho et al. | ....................... | 716/102 |
| 6,862,723 B1 * | 3/2005 | Wang et al. | .................... | 716/112 |
| 6,915,252 B1 * | 7/2005 | Li | .................................... | 703/22 |
| 7,506,277 B1 * | 3/2009 | Arora et al. | .................... | 716/122 |
| 7,810,051 B2 * | 10/2010 | Ohashi | .......................... | 716/100 |
| 8,225,263 B2 * | 7/2012 | Gotou | ........................... | 716/122 |
| 2005/0223347 A1 * | 10/2005 | Okuaki | ............................ | 716/5 |

* cited by examiner

*Primary Examiner* — A. M. Thompson
(74) *Attorney, Agent, or Firm* — Kilpatrick Townsend & Stockton LLP

(57) ABSTRACT

A method for generating a layout for a cell of an integrated circuit (IC) guided by design rule checking (DRC) is disclosed. In the method, a model is defined, wherein the model comprises a plurality of parameters for generating a layout of the cell. Next an initial layout for the cell can be generated according to an initial set of values for the plurality of parameters. Then design rule checking (DRC) is performed for the initial layout based on a set of design rules. If any violations are found, the corresponding violation reports will be associated with the model. Therefore, a new set of values for the plurality of parameters can be generated by analyzing the violation reports collectively based on the model. With the new set of values for the plurality of parameters and above steps repeated, until no violation is found, a "DRC clean" layout can be generated.

14 Claims, 4 Drawing Sheets

PARAMETERIZED CELL LAYOUT GENERATION GUIDED BY A DESIGN RULE CHECKER

CROSS REFERENCE TO RELATED APPLICATIONS

This application claims the benefit of priority of U.S. Provisional Application No. 61/585,650, filed Jan. 12, 2012, and titled "Parameterized Cell Layout Generation Guided by a Design Rule Checker", the contents of which are herein incorporated by reference in its entirety.

BACKGROUND OF THE INVENTION

1. Field of the Invention

The invention relates in general to a method for layout generation for an integrated circuits (IC), and more particular to a method for layout generation for a parameterized cell of an integrated circuit (IC) guided by design rule checking (DRC).

2. Description of the Prior Art

Analog circuit designers typically use parameterized cells (PCells) as building blocks to design analog ICs. PCells are design units which use parameter values to calculate IC layouts. An example is a PMOS PCell that takes channel width and channel length as parameters. After a user selecting the PMOS PCell and specifying values for the two parameters, a PMOS layout with the specified channel length and width is automatically generated and placed at the location indicated by the user. In addition, the generated layout satisfies all design rules that are typically described in a technology file which is set along with the definition of PCells initially. Thus, the generated PCell layout is free of design rule violations, which is also called "DRC clean".

As process technology advances, new design rules become so complex that it's very difficult, if not impossible, to generate optimal layouts for PCells that are also DRC clean. The reason is that for many complex design rules, the PCell generator has to estimate the positions and dimensions of some geometry shapes that are yet to be generated. Often times, there is a deviation between the estimate and the actual numbers. So, to play safe, PCell generators typically take a conservative approach, namely, using larger dimensions and spacing that can satisfy worst case scenarios. With this approach, the generated layouts are typically less than ideal.

FIG. 1 is an example for prior art. It shows a MOS layout which a PCell generator may generate. The layout consists of polygon 100 on poly layer for the gate of the MOS transistor, polygon 102 on diffusion layer for the source and drain, polygons 104 and 114 on metal layer (metal 1) for source and drain connections, and polygons 106, 108, 110 and 112 on contact cut layer (metal 1 to poly cut layer) for metal to diffusion connections. Dimensions and locations of the polygons in FIG. 1 may be determined in one of the following ways:

1. They may be specified directly by the user. For example, the horizontal span of polygon 100 is the value of the channel length parameter specified by the user.
2. They may be determined by user specified values and design rule values specified in the associated technology file. For example, the vertical span of polygon 100 is the sum of channel width parameter value specified by the user plus twice of the minimum value of extension of poly over diff, which is specified in the technology file.
3. They may be determined by specifications in the technology file. For example, enclosures 120 and 122 are metal over contact minimum required values, and are specified in the technology file.

As process technologies advance, design rules become more and more complex. Design rule values, such as metal over contact enclosures, are no longer simple constant values. Let's take enclosure 120 and enclosure 122 in FIG. 1 as an example. For advanced design rules, enclosures 120 and 122 may depend on the dimensions of polygon 104, dimensions of polygon 114, the distance between 104 and 114, and the parallel run length between 104 and 114. In other words, in order to calculate the optimal values for 120 and 122, we need to know the dimensions of 104, 114, the distance in between, and the parallel run length between 104 and 114.

Typically, PCell layouts are generated in a sequential manner. In FIG. 1 for example, polygons 100, 102 and 104 may be generated first; then polygons 106 and 108 are generated. The values for metal to contact enclosures will decide where and how many the contact polygons (e.g. polygons 106, 108) are to be generated. For complex enclosure rules, the value is a function of the dimensions of metals 104 and 114, the distance in between, and the parallel run length between 104 and 114. However, at this moment, polygon 114 is not generated yet, and so its location and dimensions are not known. In order to calculate the values for 120 and 122, we have to estimate the dimensions and the location for polygon 114. Later, when polygon 114 is generated, if it comes out as exact as previously estimated, then everything is good. More often than not, the actual dimensions and location for 114 are different from original estimation, and a DRC violation may occur. To fix the DRC violation, we will need to go back to re-calculate the values for 120 and 122 with a better estimation for polygon 114, and re-generate portions of the layout. The new result may be all correct, or may be not. If it's not correct, the same steps will have to repeat once more. This makes the layout generation complicated.

Besides the example for enclosure issue shown above, there may be many other advanced design rules that have to be taken care of. Each design rule posts a different challenge and has to be satisfied in the final layout.

Therefore, what is needed is a systematic way to efficiently and effectively generate layouts that satisfy all the advanced design rules while not relying on the estimation of layout components that are yet to be generated.

SUMMARY OF THE INVENTION

One object of the present invention is to generate a layout for a cell of an integrated circuit (IC) guided by design rule checking (DRC).

In one embodiment of the present invention, a model is defined, wherein the model comprises a plurality of parameters for generating a layout of the cell. Next an initial layout for the cell can be generated according to an initial set of values for the plurality of parameters. Then design rule checking (DRC) is performed for the initial layout based on a set of design rules. If any violations are found, the corresponding violation reports will be applied to the model. A violation report typically contains information such as the name of the design rule violated, the two edges on layout objects where the violation is detected, and the minimum desirable dimension needed to clear the violation, and etc. By analyzing these pieces of information in violation reports and applying the analysis results to the model, a new set of values for the plurality of parameters can be generated. With the new set of values for the plurality of parameters and above steps repeated until no violation is found, a "DRC clean" layout can be generated.

In one embodiment, the model comprises associating each design rule with a set of properties to indicate the information of the design rule name, the category of the design rule, the corresponding components/shapes in the PCell related to the violation checking for the design rule. The properties will be included in DRC violation reports, and can be used to adjust the set of parameter values.

In one embodiment, the actions for parameter value adjusting disclosed above can be done by executing callback functions. Furthermore, callback function names may be specified in properties.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

Figure 1:
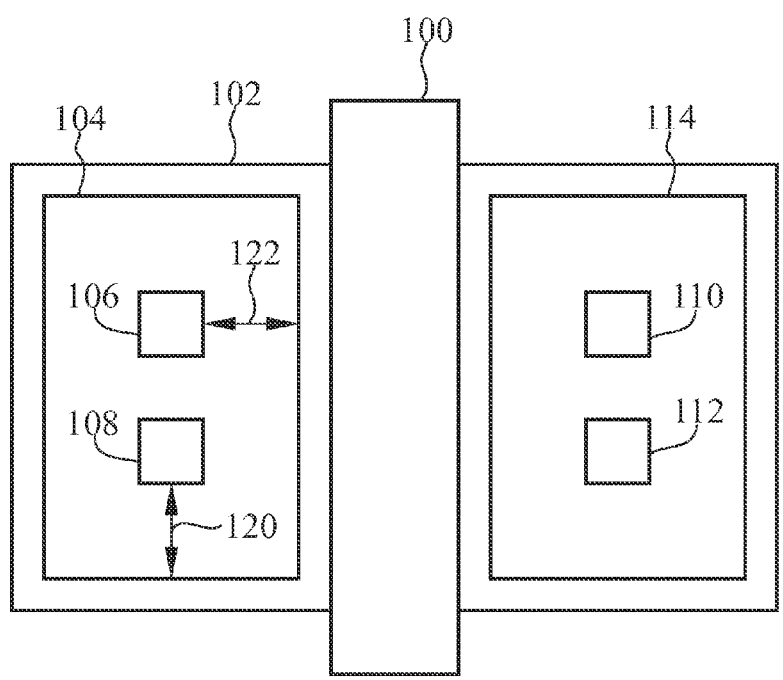
FIG. 1 illustrates an example to explain how a layout for a PCell is generated in prior art.
Figure 2:
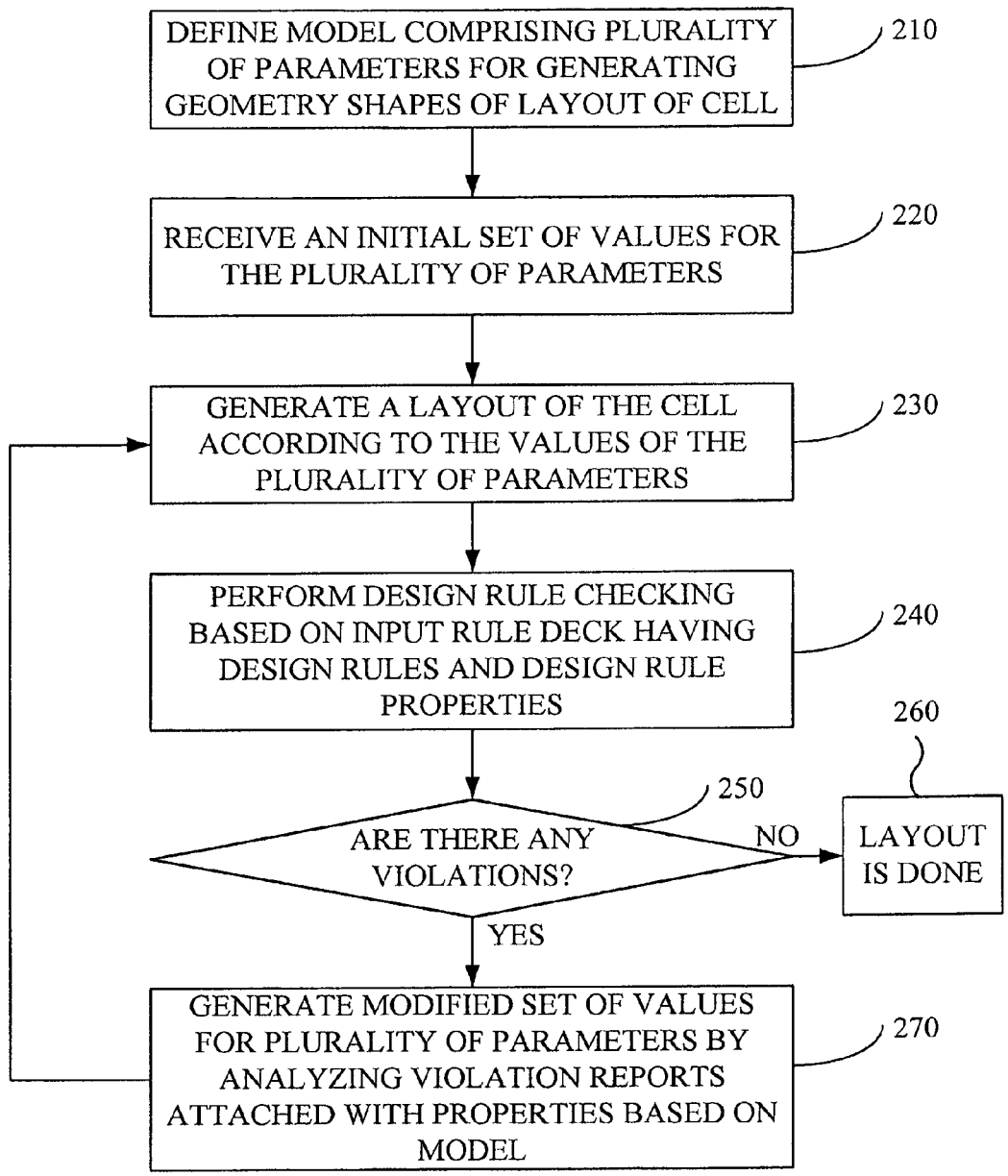
FIG. 2 depicts the schematic flow diagram of the current invention.

Please refer to FIG. 2 which depicts the schematic flow diagram of the current invention for generating a layout for a parameterized cell (PCell) of an integrated circuit (IC). Firstly, a model is defined, wherein the model comprises a plurality of parameters for generating a set of geometry shapes to form the layout of the cell (step 210). In the model, the logics of DRC violation analysis and the corresponding parameter adjustment algorithms are grouped systematically, which will be explained later. Next an initial set of values for the plurality of parameters are assigned (step 220). Thus an initial layout for the cell can be generated according to the initial set of values for the plurality of parameters (step 230).

Then, a design rule checker is invoked to perform DRC for the initial layout based on a set of design rules (step 240). If any violations are found (step 250), the corresponding violation reports will be applied to the model (step 270). A new set of values for the plurality of parameters will be generated by analyzing the violation reports collectively based on the model. With the new set of values for the plurality of parameters, step 230~step 270 are repeated until no violation is found, which means a "DRC clean" layout is generated (step 260). In one embodiment, the iteration stops when a predefined number of iteration cycles is reached before all violations are resolved.

In one embodiment, violation reports may be in the form of special type objects that the DRC checker generates and stores in the database in which PCell layouts reside. In another embodiment, violation reports may be in the form of external files that contain the descriptions for each design rule violation that the DRC checker detects, or any other forms.

In one embodiment, the model comprises associating each design rule with a set of properties. Each property indicates the information of the design rule name, the category of the design rule, the corresponding components/shapes in the PCell related to the violation checking for the design rule. Thus, when a violation is detected, the corresponding property is attached to the violation report.

To depict more details about the properties, in one embodiment, design rules can be categorized as "spacing" rules, "width" rules and "enclosure" rules. Spacing rules control the minimum distance required between two adjacent shapes; width rules control the minimum width a shape can take; and enclosure rules control the extent a shape has to cover over another shape underneath it.

As for the components/shapes in PCell, taking MOS transistor as an example, it may have "gate", "source-drain" and "contact" components. Moreover, contacts may consist of "source-drain contact cut" and "metal over source-drain contact cut". We can name each category of shapes by combining their functionality with its layer name. For example, "gate" components may be referred to as "GatePoly", "source-drain" may be referred to as "ActiveOD" (source-drain are the "active" regions of the transistor and the layer that defines the source-drain area is usually called the OD layer), "source-drain contact cut" may be referred to as "ActiveContact" (for contact cuts over active regions), and "metal over source-drain contact cut" may be referred to as "ActiveMetal".

Following is an exemplary format for design rule properties in accordance with the current invention:
{rule-name {rule-category {device-type shape-category . . . }}}

One property example is shown below:
{M1CO.EN.1 {enclosure {XTR ActiveMetal ActiveContact}}}.

It indicates that the rule name is "M1CO.EN.1" (metal on contact enclosure rule 1. Actual rule names should come from the process technology used); the rule category is "enclosure"; the device type is "XTR" (transistor type PCell); and the two objects involved are of type "ActiveMetal" and "ActiveContact".

Another property example is provided:
{M1.S.1 {spacing {XTR ActiveMetal ActiveMetal}}}.

It indicates that the rule name is "M1.S.1" (metal spacing rule 1); the rule category is "spacing"; the device type is "XTR"; and the two objects involved are both of type "ActiveMetal". The two metal objects are for the connections to source and drain contacts, respectively.

In one embodiment, properties may be specified in a property file. Upon invocation, current invention reads the design rules from a technology file and properties from a property file. It combines the two files and prepares an input rule deck in a format that the DRC checker supports. Then, it feeds the generated rule deck to the DRC checker.

Figure 3:
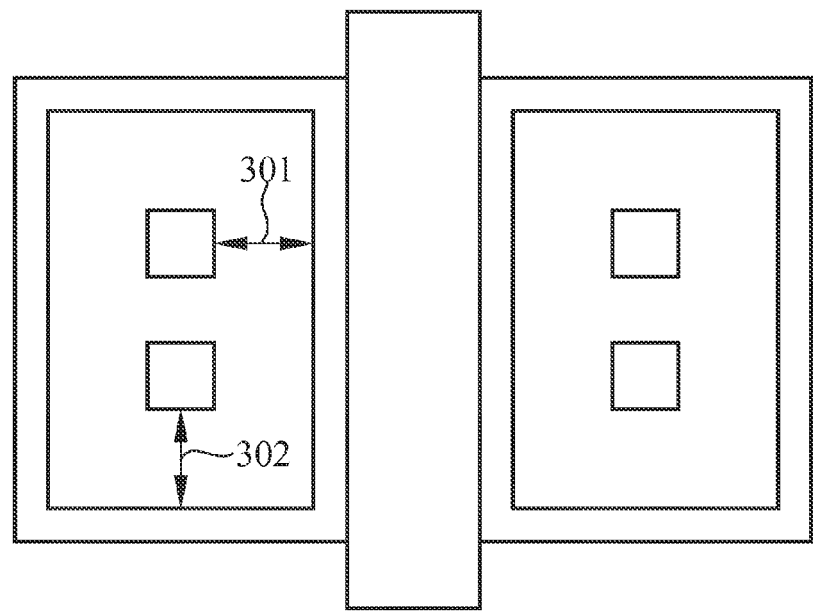
FIG. 3 shows an example of how to fix the metal 1 to contact enclosure violation.

FIG. 3 shows an example of how to fix the metal 1 to contact enclosure. To begin with, we may define the property as follows:
{M1CO.EN.1 {enclosure {XTR ActiveMetal ActiveContact}}}.

When we get a violation report containing such a property, we know we have to enlarge the enclosure for the specified metal and contact objects. The locations of the two violating edges which can be found in the violation report can lead us to the metal shape object and the contact shape object. The value for the minimum required enclosure is also available in the violation report.

Please refer to FIG. 3. To fix this DRC violation, two parameters EncX (301) and EncY (302) are defined for x-dimensional enclosure and y-dimensional enclosure respectively. Then parameter EncX (301) or parameter EncY (302) can be adjusted according to the minimum enclosure value. We can use the violation edges to decide if it's horizontal EncX (301) or vertical EncY (302) that is to be adjusted. If the two edges are horizontal edges, then it is EncY (302) that is to be adjusted. Otherwise, it's EncX (301).

Figure 4:
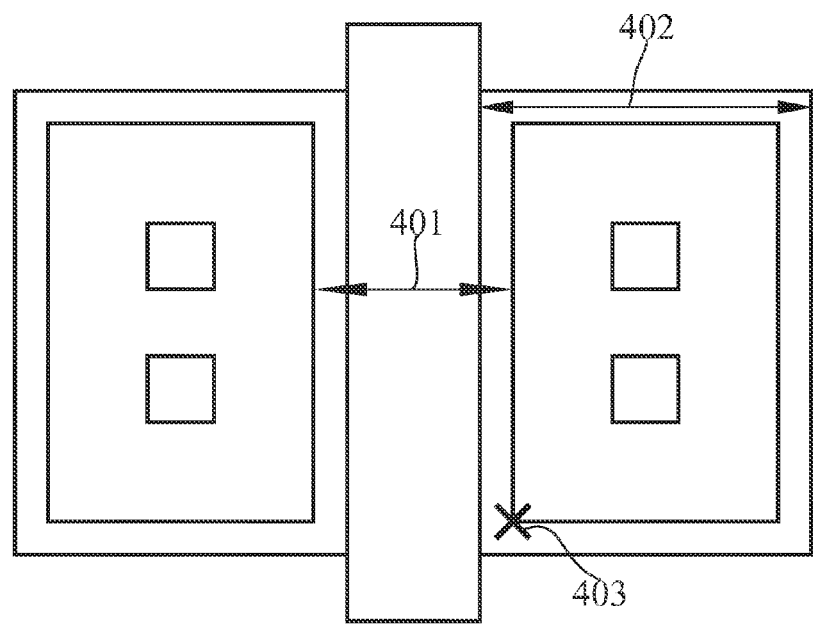
FIG. 4 shows an example of how to fix the metal spacing violation.

FIG. 4 shows an example of how to fix the metal spacing (401). We may define the property as follows:

{M1.S.1 {spacing {XTR ActiveMetal ActiveMetal}}}.

When we get a violation report containing such a property, we know we have to enlarge the spacing between the two metal objects. This may affect the following two shapes:
1. The active region (i.e. source-drain region), and
2. The associated contact(s).

To simplify the fix procedure, we limit the fix to the metal, which is on the "right-hand side", i.e. moving the shapes having larger X coordinate in the layout, leaving shapes on the "left-hand side" unchanged. To further simplify the fix procedure, we introduce two auxiliary parameters: ODlength (402) and contactMetalOrigin (contactMetalOriginX, contactMetalOriginY) (403). The ODlength (402) value determines the length of the OD region on the right-hand side, and the contactMetalOrigin (403) determines the location of the contact metal object.

To fix the metal spacing (401), we need to move the contactMetalOrigin (403) to the right. The amount can be readily calculated using the desired spacing value found in the violation report, and the current value in the layout. The other parameter, ODlength (402) may or may not need fixing. If we have to use the same contact, then ODlength (402) has to be incremented by the same amount as the displacement of contactMetalOrigin (403). On the other hand, if we can create a "narrower" contact based on the new location of contactMetalOrigin (403) and original value of ODlength (402), then we can leave ODlength (402) unchanged.

After the contactMetalOrigin (403) and ODlength (402) are determined, we can re-generate the layout for the transistor. The metal 1 spacing violation should be cleared.

Figure 5:
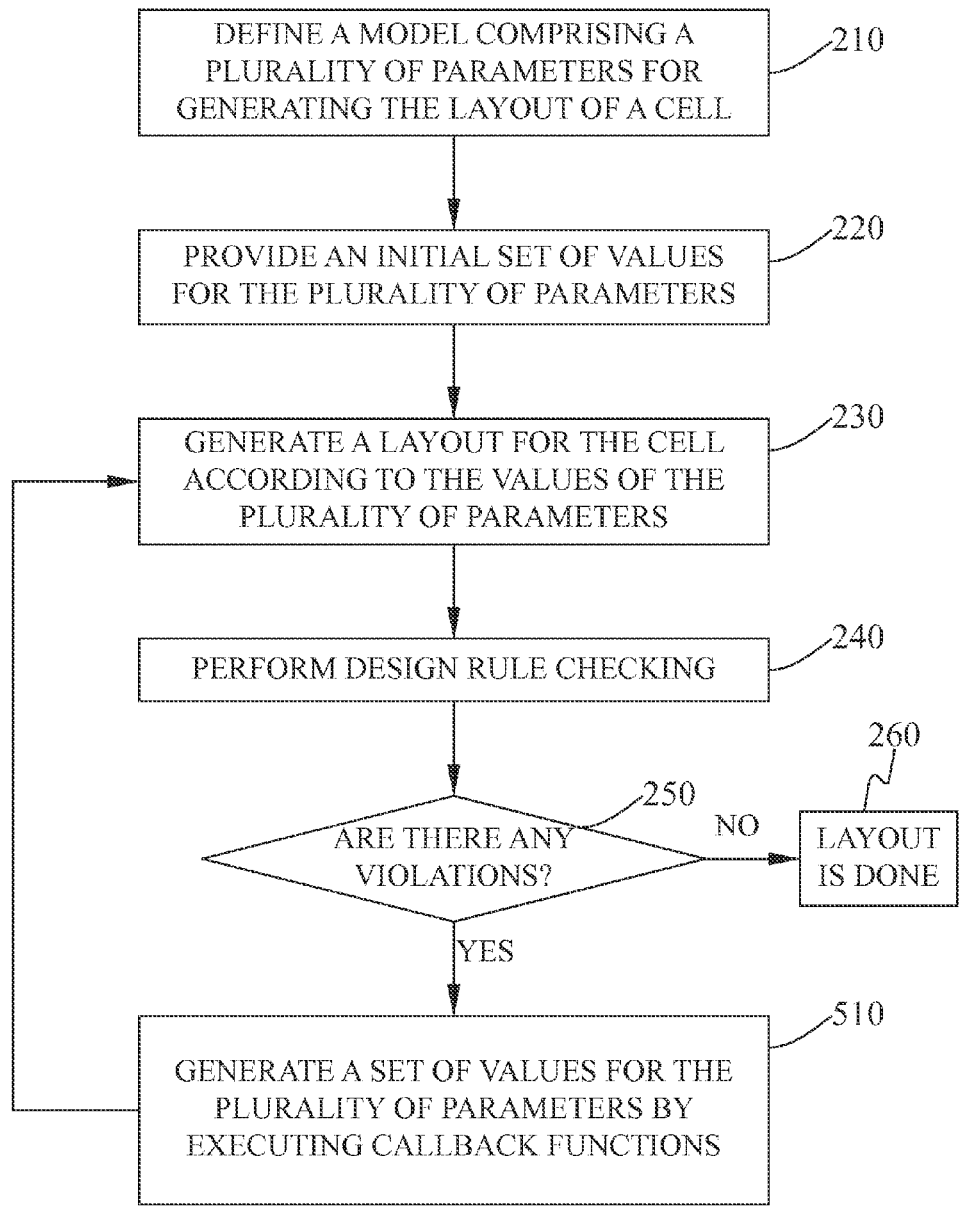
FIG. 5 illustrates a schematic flow diagram of one embodiment which contains the invocation of callback functions.

FIG. 5 illustrates a schematic flow diagram of one embodiment which contains the invocation of callback functions after DRC checking. Most of the steps have been shown in FIG. 2. In step 510, callback functions are executed in order to apply the DRC violation reports to the model for generating a new set of values for the plurality of parameters.

In one embodiment, callback function names may be specified in properties as shown in below examples:
{M1CO.EN.1 {enclosure {XTR ActiveMetal ActiveContact {FixContactMetalEnclsoureCB }}}}, and
{M1.S.1 {spacing {XTR ActiveMetal ActiveMetal {FixActiveMetalSpacingCB}}}}

Then, in each DRC violation report, we can find the callback function name, and call the function accordingly. When calling a callback function, we can pass the DRC violation report object to it. Using the properties and attributes associated with the DRC violation report objects, the callback functions can decide what parameters to adjust and by how much.

By grouping the decision making and parameter value adjusting in callback functions, the flow for layout generation for PCells with the help from a DRC checker becomes well organized.

In one embodiment, when there are multiple objects under the same shape category, we can tag the shapes with unique identifiers so that we can know which specific shape or shapes the violation is pertaining to. For example, when there are multiple fingers (number of poly gate is greater than 1) on a transistor, there will be more than 2 source-drain regions. When a metal 1 spacing rule or metal 1 to OD enclosure rule is violated, we need to know which source-drain region or which pair of source-drain regions is the source of this violation. As disclosed above, by using the information in the violation report, we can find the shape object or objects that cause the violation. Then, by using the tags in the shape objects, we know which parameters to adjust to clear the violation. The same technique can be applied to tagging contact and metal objects.

In one embodiment, to support new design rules, new entries can be added systematically to the property specification file for the new rules and new callback functions should be implemented accordingly.

To support changes to existing design rules, we just have to modify the associated callback functions accordingly.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A method for generating geometry shapes to form a layout for a parameterized cell (P-Cell) of an integrated circuit (IC) that satisfies all design rules, wherein the cell is associated with a first set of design rules, the method comprising:
receiving, at a computer, a model comprising a plurality of parameters that determine a set of geometry shapes associated with the cell;
generating, by the computer, a first set of geometry shapes according to a first set of values for the plurality of parameters;
performing, by the computer, design rule checking on the first set of geometry shapes according to an input rule deck that includes the first set of design rules and a property specification associated with each design rule in the first set of design rules;
generating, by the computer, a first set of violation reports for the first set of geometry shapes, each violation report in the first set of violation reports identifying at least one property in the property specification of at least one design rule violated in the first set of design rules, a location of one or more geometry shapes in violation, and at least one required value that satisfies the at least one design rule violated in the first set of design rules;
modifying, by the computer, the first set of values to generate a second set of values for the plurality of parameters by applying the first set of violation reports to the model; and generating, by the computer, a second set of geometry shapes according to the second set of values for the plurality of parameters.

2. The method according to claim 1, further comprising:
performing, by the computer, design rule checking on the second set of geometry shapes according to the first set of design rules;
generating, by the computer, a second set of violation reports for the second set of geometry shapes, each violation report in the first set of violation reports identifying at least one property in the property specification of at least one design rule violated in the second set of design rules, a location of one or more geometry shapes in violation, and at least one required value that satisfies the at least one design rule violated in the second set of design rules;
modifying, by the computer, the second set of values to generate a third set of values for the plurality of parameters by applying the second set of violation reports to the model; and
generating, by the computer, a third set of geometry shapes according to the third set of values for the plurality of parameters.

3. The method according to claim 1, wherein the property specification of each of the design rules associates a corresponding design rule with at least one of a set of properties, wherein each of the set of properties comprises a design rule name, the category of the design rule, a device type to which the corresponding design rule applies, and at least one category of geometry shape in the layout to which the design rule applies.

4. The method according to claim 3, wherein each of the set of properties further comprises a callback function defined by a user to handle a violation report generated when an associated design rule is violated.

5. The method according to claim 4, wherein applying the first set of violation reports to the model comprises executing, by the computer, each callback function corresponding to a property in each violation report in the first set of violation reports based on passing each violation report in the first set of violation reports as an argument to the callback function of the property included in the violation report.

6. The method according to claim 3, wherein at least one violation report in the first set of violation reports includes a set of edges that violate the design rule that caused the at least one violation report to be generated, and wherein modifying the first set of values comprises using edges information in the at least one violation report to identify one or more shape objects in the layout having the first set of geometry shapes that violate the design rule that caused the at least one violation report to be generated.

7. The method according to claim 6, wherein shape objects in the layout having the first set of geometry shapes are tagged with unique identifiers, and wherein modifying the first set of values comprises using tagged identifiers on the shape objects to determine which parameter values of the model need adjusting.

8. A non-transitory computer readable medium storing code executable by a computer for generating geometry shapes to form a layout for a parameterized cell (P-Cell) of an integrated circuit (IC) that satisfies all design rules, wherein the cell is associated with a first set of design rules, the non-transitory computer-readable medium comprising:
code for receiving a model comprising a plurality of parameters that determine a set of geometry shapes associated with the cell;
code for generating a first set of geometry shapes according to a first set of values for the plurality of parameters;
code for performing design rule checking on the first set of geometry shapes according to an input rule deck that includes the first set of design rules and a property specification associated with each design rule in the first set of design rules;
code for generating a first set of violation reports for the first set of geometry shapes, each violation report in the first set of violation reports identifying at least one property in the property specification of at least one design rule violated in the first set of design rules, a location of one or more geometry shapes in violation, and at least one required value that satisfies the at least one design rule violated in the first set of design rules;
code for modifying the first set of values to generate a second set of values for the plurality of parameters by applying the first set of violation reports to the model; and
code for generating a second set of geometry shapes according to the second set of values for the plurality of parameters.

9. The non-transitory computer-readable medium according to claim 8, further comprising:
code for performing design rule checking on the second set of geometry shapes according to the first set of design rules;
code for generating a second set of violation reports for the second set of geometry shapes, each violation report in the first set of violation reports identifying at least one property in the property specification of at least one design rule violated in the second set of design rules, a location of one or more geometry shapes in violation, and at least one required value that satisfies the at least one design rule violated in the second set of design rules;
code for modifying the second set of values to generate a third set of values for the plurality of parameters by applying the second set of violation reports to the model; and
code for generating a third set of geometry shapes according to the third set of values for the plurality of parameters.

10. The non-transitory computer-readable medium according to claim 8, wherein the property specification of each of the design rules associates a corresponding design rule with at least one of a set of properties, wherein each of the set of properties comprises a design rule name, the category of the design rule, a device type to which the corresponding design rule applies, and at least one category of geometry shape in the layout to which the design rule applies.

11. The non-transitory computer-readable medium according to claim 10, wherein each of the set of properties further comprises a callback function defined by a user to handle a violation report generated when an associated design rule is violated.

12. The non-transitory computer-readable medium according to claim 11, wherein the code for applying the first set of violation reports to the model comprises code for executing each callback function corresponding to a property in each violation report in the first set of violation reports based on passing each violation report in the first set of violation reports as an argument to the callback function of the property included in the violation report.

13. The non-transitory computer-readable medium according to claim 10, wherein at least one violation report in the first set of violation reports includes a set of edges that violate the design rule that caused the at least one violation report to be generated, and wherein the code for modifying the first set of values comprises code for using edges information in the at least one violation report to identify one or more shape objects in the layout having the first set of geometry shapes that violate the design rule that caused the at least one violation report to be generated.

14. The non-transitory computer-readable medium according to claim 13, wherein shape objects in the layout having the first set of geometry shapes are tagged with unique identifiers, and wherein the code for modifying the first set of values comprises using tagged identifiers on the shape objects to determine which parameter values of the model need adjusting.

\* \* \* \* \*